United States Patent
Liu et al.

(10) Patent No.: US 10,453,372 B2
(45) Date of Patent: Oct. 22, 2019

(54) METHOD FOR DRIVING DISPLAY PANEL AND A DISPLAY THEREOF

(71) Applicant: Wuhan China Star Optoelectronics Technology Co., Ltd., Wuhan, Hubei (CN)

(72) Inventors: Junlin Liu, Guangdong (CN); Xiang Yang, Guangdong (CN); Chun-hung Huang, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 55 days.

(21) Appl. No.: 15/744,782

(22) PCT Filed: Nov. 25, 2017

(86) PCT No.: PCT/CN2017/112979
§ 371 (c)(1),
(2) Date: Jan. 13, 2018

(87) PCT Pub. No.: WO2019/085097
PCT Pub. Date: May 9, 2019

(65) Prior Publication Data
US 2019/0130810 A1  May 2, 2019

(30) Foreign Application Priority Data

Oct. 31, 2017  (CN) .......................... 2017 1 1047736

(51) Int. Cl.
*G09G 3/20* (2006.01)
*H01L 27/12* (2006.01)

(52) U.S. Cl.
CPC ............. *G09G 3/2003* (2013.01); *G09G 3/20* (2013.01); *H01L 27/1214* (2013.01);
(Continued)

(58) Field of Classification Search
CPC combination set(s) only.
See application file for complete search history.

(56) References Cited

U.S. PATENT DOCUMENTS

2005/0093792 A1* 5/2005 Yamamoto ......... H05B 33/0803
345/83
2012/0154455 A1* 6/2012 Steyn ..................... G02B 26/02
345/690

FOREIGN PATENT DOCUMENTS

CN  1617195 A  5/2005
CN  1949344 A  4/2007
(Continued)

*Primary Examiner* — Van N Chow
(74) *Attorney, Agent, or Firm* — Hemisphere Law, PLLC; Zhigang Ma

(57) ABSTRACT

A method for driving a display panel and a display panel thereof. Method comprises: A driving circuit regulates electrical levels of the driving signals in a driving cycle transmitting to a first/second/third charging control unit corresponding to a first/second/third color sub-pixel unit respectively. Therefore, the first color sub-pixel unit is charged via a first thin-film-transistor of the first charging control unit by charging data, the second color sub-pixel unit is charged via a first thin-film-transistor and a second thin-film-transistor of the second charging control unit by said charging data, and the third color sub-pixel unit is charged via a first thin-film-transistor of the third charging control unit by charging data. Therefore, electrical level switching of driving signals by driver circuit is reduced resulting reduced power consumption of driving display panel.

6 Claims, 7 Drawing Sheets

(52) U.S. Cl.
CPC .............. *G09G 2310/0264* (2013.01); *G09G 2310/0275* (2013.01); *G09G 2310/08* (2013.01)

(56) References Cited

FOREIGN PATENT DOCUMENTS

| | | |
|---|---|---|
| CN | 106097955 A | 11/2016 |
| CN | 106297640 A | 1/2017 |

\* cited by examiner

METHOD FOR DRIVING DISPLAY PANEL AND A DISPLAY THEREOF

RELATED APPLICATIONS

The present application is a National Phase of International Application Number PCT/CN2017/112979, filed on 2017 Nov. 25, and claims the priority of China Application No. 201711047736.4, filed on 2017 Oct. 31.

FIELD OF THE DISCLOSURE

The present invention relates to electrical technology, and more particularly to a method for driving display panel and a display thereof.

BACKGROUND

Display panels are applied in various terminals (cell phones, tablets, TVs). With evolving of display technologies, manufacturing display panel is also faced with higher requirements. Not only higher definition and rich color displaying, but also less power consumption during displaying should be taken into consideration.

When driving display panels, the driving circuit charges the pixel units in display panel, wherein pixel units are composed of red color (R) sub-pixel units, green color (G) sub-pixel units, and blue color (B) sub-pixel units. The driving circuit is connected with a plurality of charging control units. Each charging control units generally is composed of n-channel metal oxide semiconductor (N-Metal-Oxide-Semiconductor, NMOS) and p-channel metal oxide semiconductor (P-Metal-Oxide-Semiconductor, PMOS). Each charging control units is adapted to control charging of sub-pixel units with single type of color. Driving circuit transmits driving signals to control the NMOS and PMOS of charging control unit as conducting or non-conducting. The NMOS and PMOS of charging control unit are controlled as conducting when charging is required, so as to charge the sub-pixel unit via NMOS and PMOS of the charging control unit by charging data transmitted by driving circuit. When charging of one sub-pixel unit ends, driving circuit transmits driving signals to control the NMOS and PMOS of the charging control unit connected with the sub-pixel as non-conducting. However, the electrical level switching of driving signals transmitted by driving circuit to control NMOS and PMOS of the charging control units as conducting or non-conducting is the main cause of power consumption when display panels are driven.

SUMMARY

One embodiment of present invention discloses a driving method for display panel and a display panel thereof, which the electrical level switching of the driving signals transmitted by driver circuit is reduced, therefore, power consumption of driving display panel is reduced.

In one aspect, one embodiment of present invention discloses a method for driving a display panel, wherein the display panel comprises a driving circuit, a plurality of charging control units, and a plurality of pixel units, each said pixel units comprises a first color sub-pixel unit, a second color sub-pixel unit, and a third color sub-pixel unit, brightness of each said second color sub-pixel units has largest proportion among each said sub-pixel units, each said charging control units is composed of a first thin-film-transistor and a second thin-film-transistor, initial state of each said first thin-film-transistors and each said second thin-film-transistors is non-conducting, said driving circuit is connected with said charging control units to transmit a driving signal and a charging data to each said charging control units, each said charging control units is connected with sub-pixel units of corresponding color respectively to control charging of sub-pixel units with single type of color, said method comprises:

Regulating electrical levels of the driving signals transmitted by said driving circuit in a driving cycle to a first charging control unit corresponding to said first color sub-pixel unit, a second charging control unit corresponding to said second color sub-pixel unit, and a third charging control unit corresponding to said third color sub-pixel unit; charging said first color sub-pixel unit via a first thin-film-transistor of said first charging control unit by said charging data; charging said second color sub-pixel unit via a first thin-film-transistor and a second thin-film-transistor of said second charging control unit by said charging data; and charging said third color sub-pixel unit via a first thin-film-transistor of said third charging control unit by said charging data.

In another aspect, one embodiment of present invention discloses a display panel comprising: a driving circuit; a plurality of charging control units wherein each said charging control units is composed of a NMOS and a PMOS; a plurality of pixel units wherein each said pixel units comprises a first color sub-pixel unit, a second color sub-pixel unit, and a third color sub-pixel unit; said driving circuit is connected with said charging control units to transmit a driving signal and a charging data to each said charging control units; and each said charging control units is connected with sub-pixel units of corresponding color respectively to control charging of sub-pixel units with single type of color.

In one embodiment of present invention; driving circuit is adapted to regulate electrical levels of the driving signals in a driving cycle transmitted to a first charging control unit corresponding to said first color sub-pixel unit; a second charging control unit corresponding to said second color sub-pixel unit, and a third charging control unit corresponding to said third color sub-pixel unit, thereby to charge said first color sub-pixel unit via a first thin-film-transistor of said first charging control unit by said charging data, to charge said second color sub-pixel unit via a first thin-film-transistor and a second thin-film-transistor of said second charging control unit by said charging data, and to charge said third color sub-pixel unit via a first thin-film-transistor of said third charging control unit by said charging data. The electrical level switching of the driving signals transmitted by driver circuit is reduced, therefore, power consumption of driving display panel is reduced.

BRIEF DESCRIPTION OF THE DRAWINGS

Accompanying drawings are provided for clearly explanation of technical solutions of present invention. Necessary drawing for the embodiment would be brifed introduced. Apparently, the drawings in the description below are merely some embodiments of present invention, a person skilled in the art can obtain other drawings according to these drawings without creative efforts. In the figures.

DETAILED DESCRIPTION OF PREFERRED EMBODIMENTS

Figure 1:
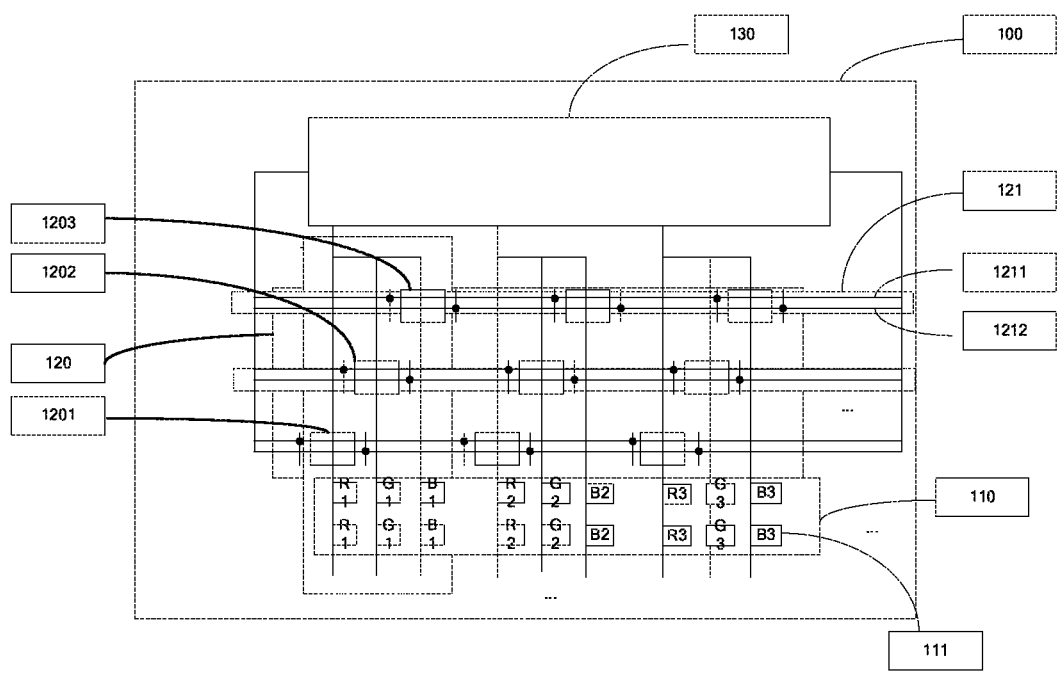
FIG. 1 is a structural schematic view of a display panel according to an embodiment of present invention.

Embodiments of present invention are described in detail and more clearly below with references to the accompanying drawings and specific embodiments. Apparently, the embodiments described here are merely some embodiments of present invention, a person skilled in the art can obtain other embodiments according to embodiment of present invention without creative efforts which should be included in the protection scope of present invention Referring to FIG. 1, it is a structural schematic view of a display panel 100 comprising a plurality of pixel units 110, a plurality of charging control units 120, and a driving circuit 130.

The pixel units 110 are composed of a plurality of sub-pixel units 111 including first color sub-pixel units, second color sub-pixel units, and third color sub-pixel units which said first color sub-pixel unit displays red color (R), said second color sub-pixel unit displays green color (G), and said third color sub-pixel unit displays blue color (B).

Each charging control units 120 is composed of a first thin-film-transistor and a second thin-film-transistor. The initial state of each said first thin-film-transistors and each said second thin-film-transistors is non-conducting, wherein, said first thin-film-transistor is NMOS and said second thin-film-transistor is PMOS.

The charging control units 120 are connected with the driving circuit 130 via scanlines 121 and datalines 122. The pixel units 110 are connected with the charging control units 120 via datalines 122. The scanlines 121 include a first scanline 1211 and a second scanline 1212. The first scanline 1211 is connected with the driving circuit 130 and the NMOS of charging control units 120 in order to transmit the driving signals sent by driving circuit 130 to the NMOS of charging control units 120 so as to control the NMOS as conducting or non-conducting. The second scanline 1212 is connected with the driving circuit 130 and the PMOS of charging control units 120 in order to transmit the driving signals sent by driving circuit 130 to the PMOS of charging control units 120 so as to control the PMOS as conducting or non-conducting.

When at least one of NMOS and PMOS of the charging control unit is conducting, the charging data sent by driving circuit 130 is transmitted to corresponding sub-pixel units 111 via datalines 122, and charge sub-pixel units 111, thereby, the charging procedure of the display panel is completed.

Figure 2A:
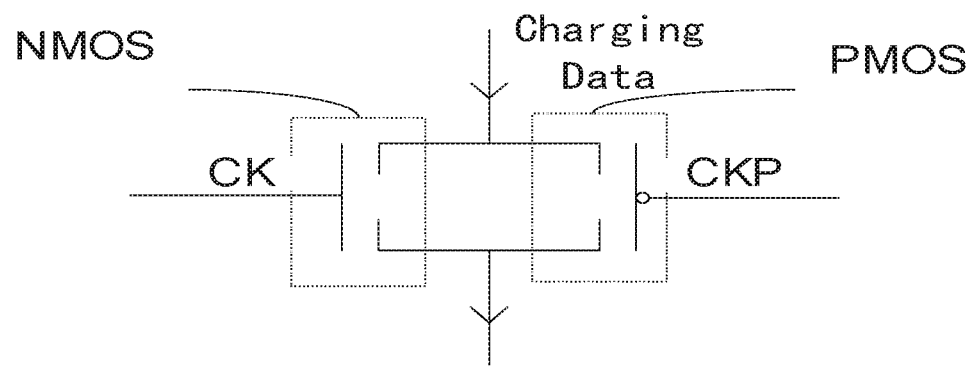
FIG. 2a is a structural schematic view of a charging control unit as non-conducting according to an embodiment of present invention.

FIG. 2a is a structural schematic view of the charging control unit 120. Wherein, a driving signal CK is transmitted to the gate of the NMOS of charging control unit 120 via the first scanline 1211. The charging control unit 120 controls the NMOS as conducting or non-conducting according to the driving signal CK. When the electrical level of the driving signal CK is positive, the NMOS is conducting. Wherein, a driving signal CKP is transmitted to the gate of the PMOS of charging control unit 120 via the second scanline 1212. The charging control unit 120 controls the PMOS as conducting or non-conducting according to the driving signal CKP. When the electrical level of the driving signal CKP is negative, the PMOS is conducting. To more explanation, said positive electrical level is the one which voltage level is higher than 0V, said negative electrical level is the one which voltage level is lower than 0V, and said zero electrical level is the one which voltage level is 0V.

Figure 2B:
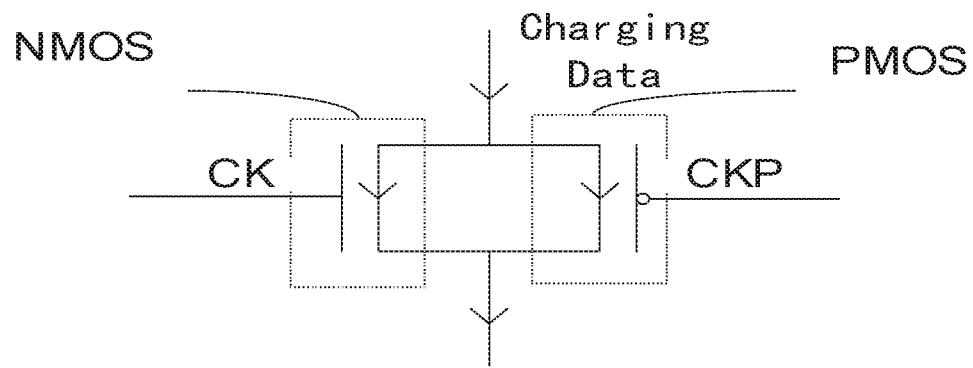
FIG. 2b is a structural schematic view of a charging control unit as conducting according to an embodiment of present invention.
Figure 2C:
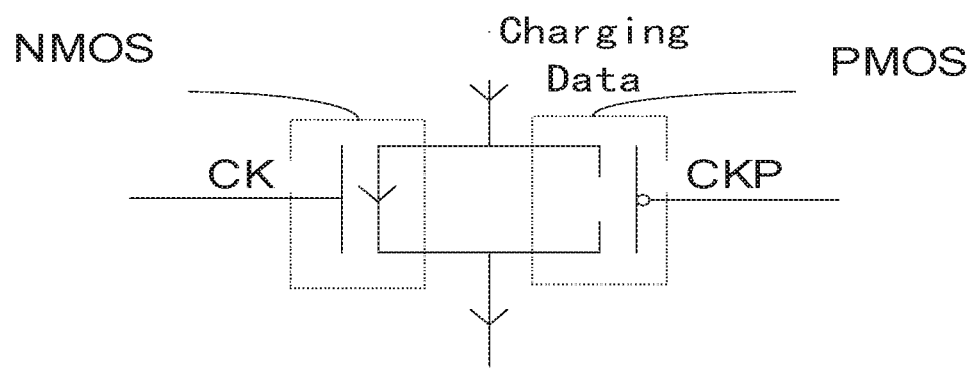
FIG. 2c is a structural schematic view of a charging control unit as conducting according to another embodiment of present invention.

As FIG. 2a illustrates, when the electrical level of driving signal CK and the driving signal CKP are both 0V, the NMOS and PMOS of the charging control unit 120 are both non-conducting. As FIG. 2b illustrates, when the electrical level of driving signal CK is positive and the electrical level of driving signal CKP is negative, the NMOS and PMOS of the charging control unit 120 are both conducting. As FIG. 2c illustrates, when the electrical level of driving signal CK is positive and the electrical level of driving signal CKP is zero, the NMOS of the charging control unit 120 is conducting, and the PMOS of the charging control unit 120 is non-conducting.

Figure 3A:
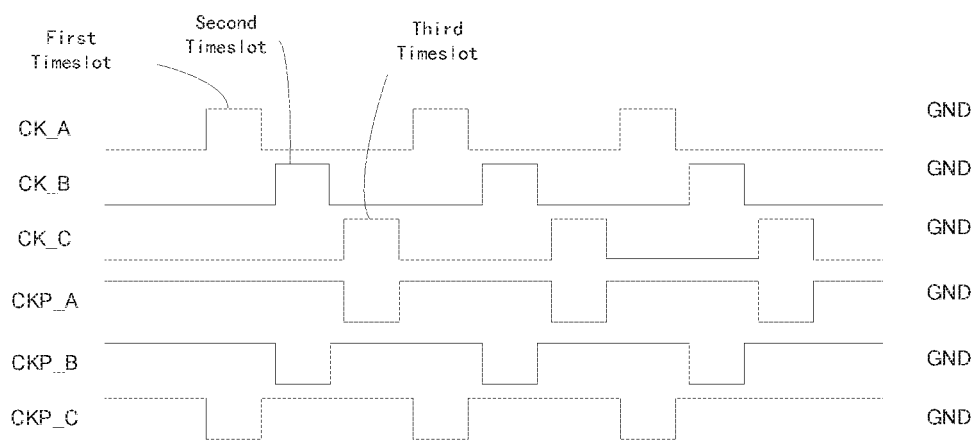
FIG. 3a is a sequence diagram of a driving signal transmitted by a driving circuit according to an embodiment of conventional arts.

Referring to FIG. 3a, it is a sequence diagram of a driving signal transmitted by driving circuit 130 in conventional arts. As FIG. 3a illustrates, each 3 timeslots form a driving cycle. CK_A and CKP_A are the driving signals transmitted by driving circuit to first color sub-pixel units (red color R). CK_B and CKP_B are the driving signals transmitted by driving circuit to second color sub-pixel units (green color G). CK_C and CKP_C are the driving signals transmitted by driving circuit to third color sub-pixel units (blue color B). In each first timeslot of driving cycles, the electrical level of CK_A is positive, the electrical level of CKP_A is negative. At this time, the NMOS and PMOS of charging control unit connected with first color sub-pixel unit (Red color R) are both conducting. When first timeslot ends, the electrical level of CK_A and CKP_A are both zero and the NMOS and PMOS of the charging control unit are both non-conducting. In each second timeslot of driving cycles, the electrical level of CK_B is positive, the electrical level of CKP_B is negative. At this time, the NMOS and PMOS of charging control unit connected with second color sub-pixel unit (Green color G) are both conducting. When second timeslot ends, the electrical level of CK_B and CKP_B are both zero and the NMOS and PMOS of the charging control unit are both non-conducting. In each third timeslot of driving cycles, the electrical level of CK_C is positive, the electrical level of CKP_C is negative. At this time, the NMOS and PMOS of charging control unit connected with third color sub-pixel unit (Blue color B) are both conducting. When third timeslot ends, the electrical level of CK_C and CKP_C are both zero and the NMOS and PMOS of the charging control unit are both non-conducting.

As FIG. 3a illustrates, when driving the display panel for displaying, the driving signals transmitted by the driving circuit would change the electrical level 6 times in each driving cycle. Relatively, the NMOS of the charging control unit connected with the driving circuit would experience 3 times of conducting and non-conducting. The PMOS of the charging control unit connected with the driving circuit would also experience 3 times of conducting and non-conducting.

Above all, in conventional arts, when driving the display panel for displaying, the driving circuit transmits driving signals to pixel units for charging, and control the NMOS and PMOS of the charging control units connected with the sub-pixel units as conducting. When charging of the sub-pixel units is completed, the driving circuit controls the NMOS and PMOS of the charging control units connected with the sub-pixel units as non-conducting. The electrical level of driving signals transmitted by driving circuit is required to switch at high frequency so as to controls the NMOS and PMOS of the charging control unit as conducting or non-conducting, resulting in higher power consumption when driving display panel.

Generally, the relationship of brightness of one pixel unit and sub-pixel units pix_R, pix_G, pix_B is:

$$pix\_color=0.299*pix\_R+0.587*pix\_G+0.114*pix\_B$$

wherein, pix_color represents the brightness of one pixel unit, pix_R represent the brightness of red color sub-pixel unit, pix_G represent the brightness of green color sub-pixel unit, pix_B represent the brightness of blue color sub-pixel unit. As above equation illustrates that the brightness of green color sub-pixel unit, pix_G, has 58.7% proportion of brightness.

Therefore, one embodiment of present invention controls the PMOS of the charging control units connected with red color sub-pixel and blue color sub-pixel, keeps them non-conducting. When charging red color sub-pixel unit and blue color sub-pixel unit, only the NMOS of the charging control unit connected with them is conducting. When charging green color sub-pixel unit, the NMOS and PMOS of the charging control unit connected with it is conducting. Therefore, it would not impact the overall brightness of single pixel. Moreover, the electrical level switching and counts of PMOS of the charging control unit as conducting or non-conducting during driving display panel are reduced, resulting in reduce of power consumption during driving display panel.

Figure 3B:
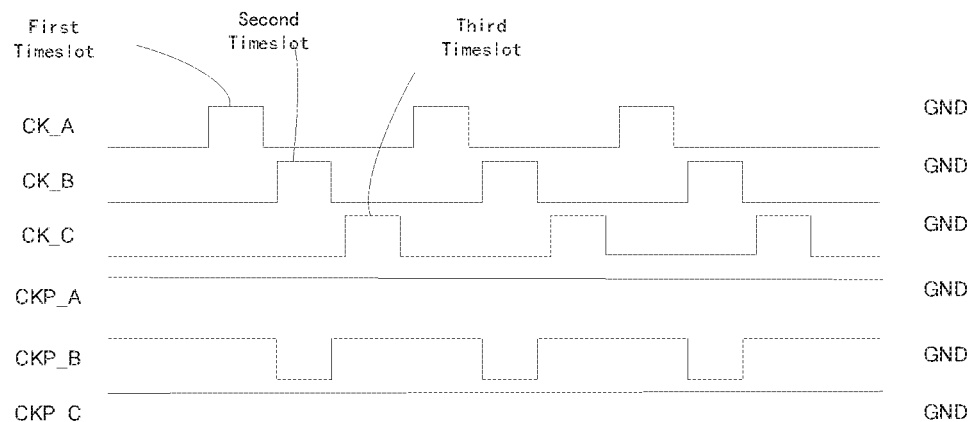
FIG. 3b is a sequence diagram of a driving signal transmitted by a driving circuit according to another embodiment of present invention.

Referring to FIG. 3b, it is a sequence diagram of a driving signal transmitted by driving circuit 130 of an embodiment of present invention. As FIG. 3b illustrates, each 3 timeslots form a driving cycle. CK_A and CKP_A are the driving signals by driving circuit to first color sub-pixel units (red color R). CK_B and CKP_B are the driving signals by driving circuit to second color sub-pixel units (green color G). CK_C and CKP_C are the driving signals by driving circuit to third color sub-pixel units (blue color B).

In each first timeslot of driving cycles, the electrical level of CK_A is positive, the electrical level of CKP_A is zero. At this time, the NMOS of charging control unit connected with first color sub-pixel unit (Red color R) is conducting and PMOS of charging control unit connected with first color sub-pixel unit (Red color R) is non-conducting. When first timeslot ends, the electrical level of CK_A is changed to zero and the electrical level of CKP_A is kept zero, and the NMOS and PMOS of the charging control unit are both non-conducting.

In each second timeslot of driving cycles, the electrical level of CK_B is positive, the electrical level of CKP_B is negative. At this time, the NMOS and PMOS of charging control unit connected with second color sub-pixel unit (Green color G) are both conducting. When second timeslot ends, the electrical level of CK_B and CKP_B are both changed to zero and the NMOS and PMOS of the charging control unit are both non-conducting.

In each third timeslot of driving cycles, the electrical level of CK_C is positive, the electrical level of CKP_C is zero. At this time, the NMOS of charging control unit connected with third color sub-pixel unit (Blue color B) is conducting and PMOS of charging control unit connected with third color sub-pixel unit (Blue color B) is non-conducting. When third timeslot ends, the electrical level of CK_C is changed to zero and the electrical level of CKP_C is kept zero and the NMOS and PMOS of the charging control unit are both non-conducting.

As FIG. 3b illustrates, when driving the display panel for displaying, the driving signals transmitted by the driving circuit would only change the electrical level 4 times in each driving cycle. Relatively, the NMOS of the charging control unit connected with the driving circuit would experience 3 times of conducting and non-conducting. The PMOS of the charging control unit connected with the driving circuit would only experience 1 time of conducting and non-conducting. The power consumption during driving display panel is apparently reduced.

Figure 4:
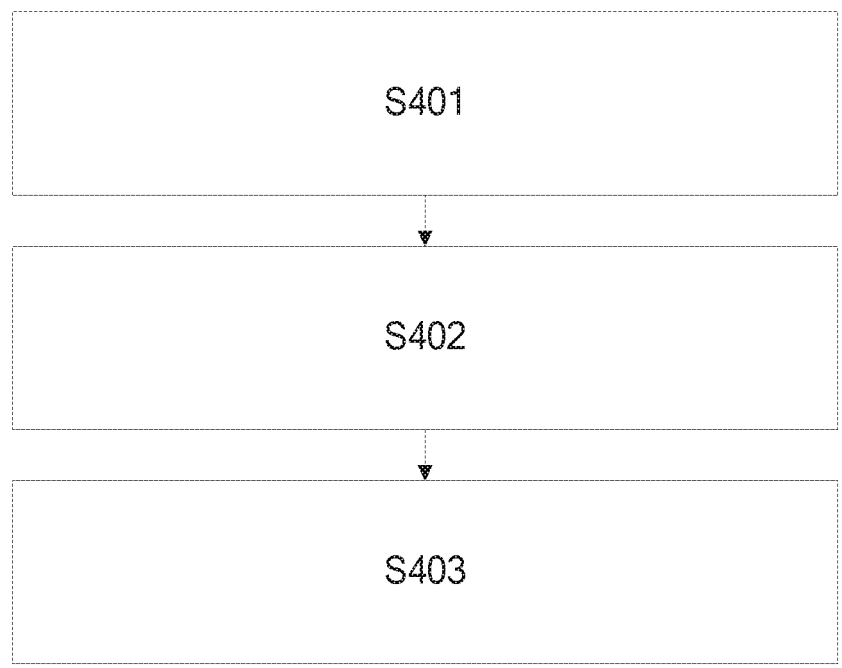
FIG. 4 is a flowchart of a method of driving display panel according to an embodiment of present invention.

Referring to FIG. 4 which is a flowchart of a method of driving display panel according to an embodiment of present invention, the method comprises:

S401, regulating electrical levels of the driving signals transmitted by said driving circuit in said first timeslot to said first charging control unit corresponding to said first color sub-pixel unit, and charging said first color sub-pixel unit via said first thin-film-transistor of said first charging control unit by said charging data.

In one embodiment, the first thin-film-transistor is NMOS, the second thin-film-transistor is PMOS, and the first color sub-pixel unit displays red color.

In a display panel 100 structure as illustrated in FIG. 1, when at the beginning of the first timeslot, driving circuit 130 transmits the driving signals with positive electrical level to NMOS of the first charging control unit 1201 via the first scanline 1211, transmits the driving signals with zero electrical level to PMOS of the first charging control unit 1201 via the second scanline 1212. Thereby, it will enable the NMOS of the first charging control unit 1201 conducting and keep the PMOS of the first charging control unit 1201 non-conducting. Charging of the red color sub-pixel unit via the NMOS of the first charging control unit 1201 by the charging data transmitted by driving circuit 130 is then started.

When at the end of the first timeslot, driving circuit 130 regulates the electrical level of the driving signals to NMOS of the first charging control unit 1201 from positive to zero, and the electrical level of the driving signals to PMOS of the first charging control unit 1201 keeping zero. Thereby, it will enable the NMOS of the first charging control unit 1201 non-conducting and keep the PMOS of the first charging control unit 1201 non-conducting. Charging of the red color sub-pixel unit via the NMOS of the first charging control unit 1201 is then stopped.

S402, regulating electrical levels of the driving signals transmitted by said driving circuit in said second timeslot to said second charging control unit corresponding to said second color sub-pixel unit, and charging said second color sub-pixel unit via said first thin-film-transistor and said second thin-film-transistor of said second charging control unit by said charging data.

In one embodiment, the first thin-film-transistor is NMOS, the second thin-film-transistor is PMOS, and the second color sub-pixel unit displays green color.

In a display panel 100 structure as illustrated in FIG. 1, when at the beginning of the second timeslot, driving circuit 130 transmits the driving signals with positive electrical level to NMOS of the second charging control unit 1202 via the first scanline 1211, transmits the driving signals with negative electrical level to PMOS of the second charging control unit 1202 via the second scanline 1212. Thereby, it will enable the NMOS and PMOS of the second charging control unit 1202 both conducting. Charging of the green color sub-pixel unit via the NMOS and PMOS of the second charging control unit 1202 by the charging data transmitted by driving circuit 130 is then started.

When at the end of the second timeslot, driving circuit 130 regulates the electrical level of the driving signals to NMOS of the second charging control unit 1202 from positive to zero, and the electrical level of the driving signals to PMOS of the second charging control unit 1202 from negative to zero. Thereby, it will enable the NMOS and PMOS of the second charging control unit 1202 both non-conducting. Charging of the green color sub-pixel unit via the NMOS and PMOS of the second charging control unit 1202 is then stopped.

S403, regulating electrical levels of the driving signals transmitted by said driving circuit in said third timeslot to said third charging control unit corresponding to said third color sub-pixel unit, and charging said third color sub-pixel unit via said first thin-film-transistor of said third charging control unit by said charging data.

In one embodiment, the first thin-film-transistor is NMOS, the second thin-film-transistor is PMOS, and the third color sub-pixel unit displays blue color.

In a display panel 100 structure as illustrated in FIG. 1, when at the beginning of the third timeslot, driving circuit 130 transmits the driving signals with positive electrical level to NMOS of the third charging control unit 1203 via the first scanline 1211, transmits the driving signals with zero electrical level to PMOS of the third charging control unit 1203 via the second scanline 1212. Thereby, it will enable the NMOS of the third charging control unit 1203 conducting and keep the PMOS of the third charging control unit 1203 non-conducting. Charging of the blue color sub-pixel unit via the NMOS of the third charging control unit 1203 by the charging data transmitted by driving circuit 130 is then started.

When at the end of the third timeslot, driving circuit 130 regulates the electrical level of the driving signals to NMOS of the third charging control unit 1203 from positive to zero, and the electrical level of the driving signals to PMOS of the third charging control unit 1203 keeping zero. Thereby, it will enable the NMOS of the third charging control unit 1203 non-conducting and keep the PMOS of the third charging control unit 1203 non-conducting. Charging of the blue color sub-pixel unit via the NMOS of the third charging control unit 1203 is then stopped.

To more explanation, the embodiment of present invention is to use NMOS as first thin-film-transistor and PMOS as second thin-film-transistor for illustration. Using of PMOS as first thin-film-transistor and NMOS as second thin-film-transistor also works. The embodiment of present invention is not mean to be limiting here.

In the embodiment of present invention, when driving display panel, the PMOS of the charging control unit connected with first color sub-pixel unit and third color sub-pixel unit are kept non-conducting, the charging is completed only via NMOS. Without influencing the overall brightness of the pixel unit, the electrical level switching and counts of PMOS of the charging control unit as conducting or non-conducting are reduced, resulting in reduce of power consumption during driving display panel.

Figure 5:
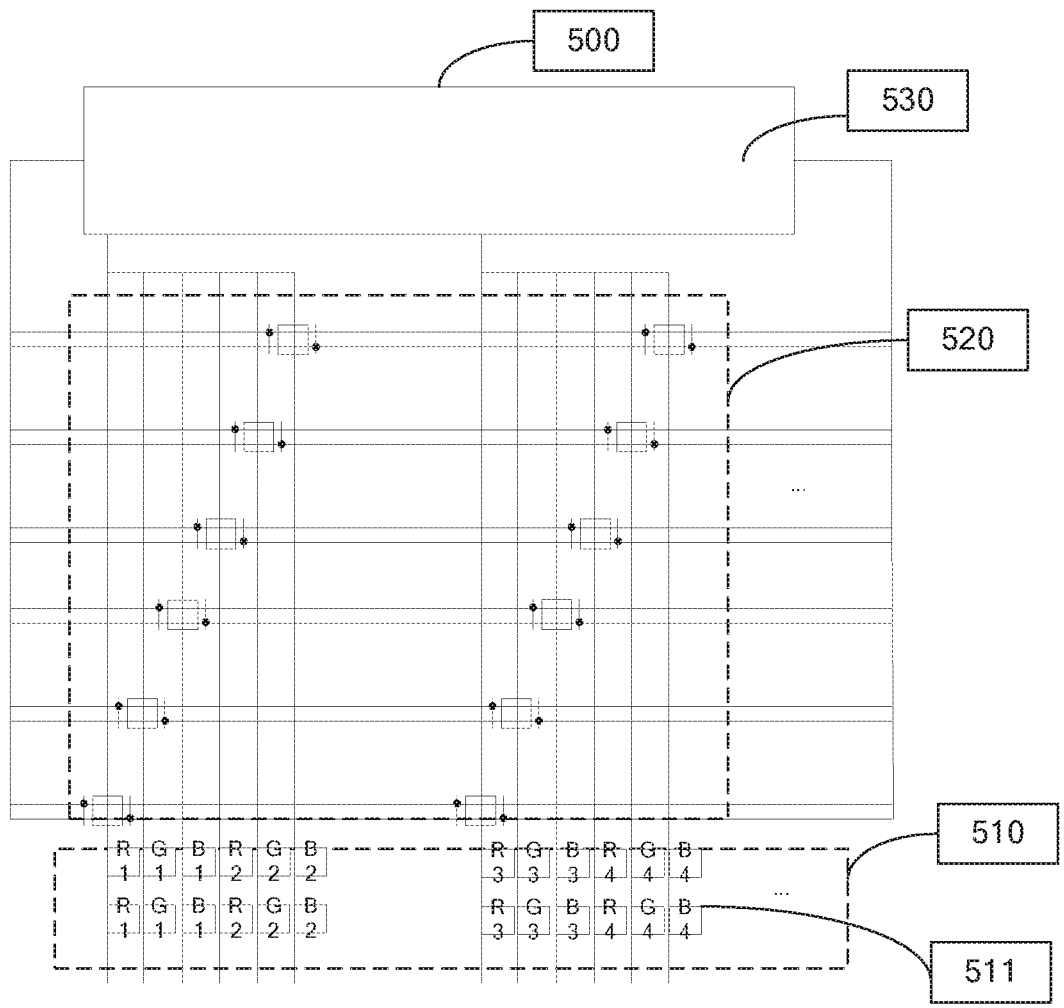
FIG. 5 is a structural schematic view of a display panel according to another embodiment of present invention.

Referring to FIG. 5, it is another embodiment of present invention of a display panel 500 comprising a plurality of pixel units 510, a plurality of charging control units 520, and a driving circuit 530.

The pixel units 510 are composed of a plurality of sub-pixel units 511 including first color sub-pixel units, second color sub-pixel units, and third color sub-pixel units which said first color sub-pixel unit displays red color (R), said second color sub-pixel unit displays green color (G), and said third color sub-pixel unit displays blue color (B).

Each charging control units 520 is composed of a first thin-film-transistor and a second thin-film-transistor. The initial state of each said first thin-film-transistors and each said second thin-film-transistors is non-conducting, wherein, said first thin-film-transistor is NMOS and said second thin-film-transistor is PMOS.

Figure 6A:
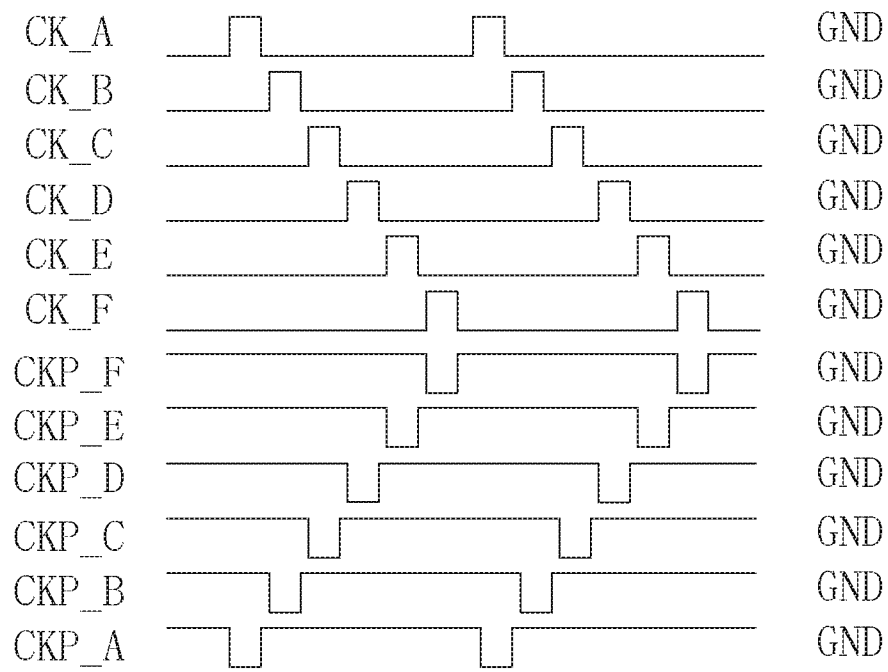
FIG. 6a is a sequence diagram of a driving signal transmitted by a driving circuit according to another embodiment of conventional arts.

Referring to FIG. 6a, it is a sequence diagram of a driving signal transmitted by driving circuit in conventional arts based in the schematic structure in FIG. 5. As FIG. 6a illustrates, each 6 timeslots form a driving cycle. CK_A and CKP_A are the driving signals transmitted by driving circuit to first color sub-pixel units. CK_B and CKP_B are the driving signals transmitted by driving circuit to second color sub-pixel units. CK_C and CKP_C are the driving signals transmitted by driving circuit to third color sub-pixel units. CK_D and CKP_D are the driving signals transmitted by driving circuit to first color sub-pixel units. CK_E and CKP_E are the driving signals transmitted by driving circuit to second color sub-pixel units. CK_F and CKP_F are the driving signals transmitted by driving circuit to third color sub-pixel units.

As FIG. 6a illustrates, when driving the display panel for displaying, the driving signals transmitted by the driving circuit would change the electrical level 12 times in each driving cycle. Relatively, the NMOS of the charging control unit connected with the driving circuit would experience 6 times of conducting and non-conducting. The PMOS of the charging control unit connected with the driving circuit would also experience 6 times of conducting and non-conducting.

Figure 6B:
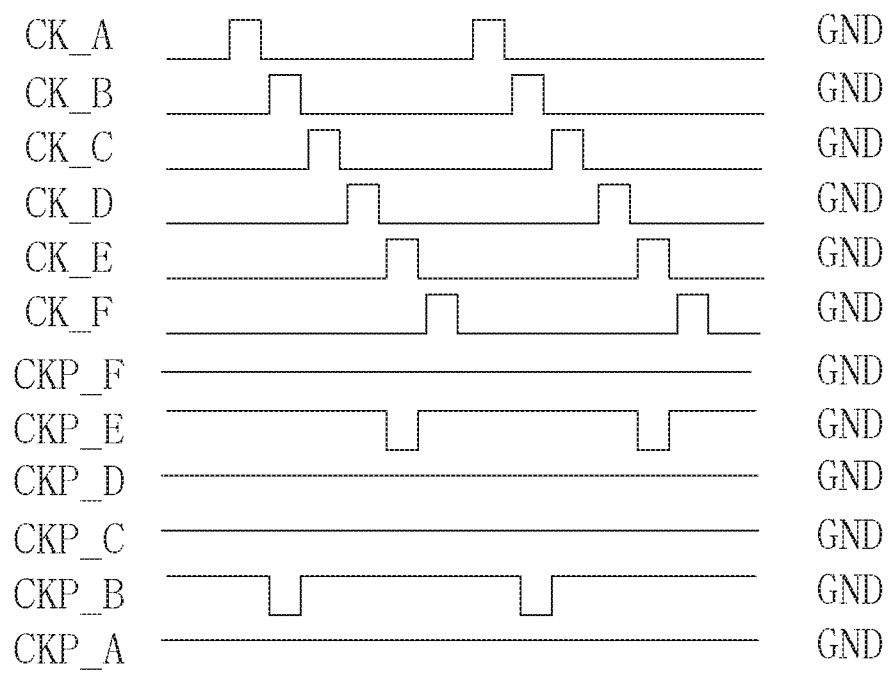
FIG. 6b is a sequence diagram of a driving signal transmitted by a driving circuit according to another embodiment of present invention.

Referring to FIG. 6b, it is a sequence diagram of a driving signal transmitted by driving circuit of an embodiment of present invention. As FIG. 6b illustrates, each 6 timeslots form a driving cycle.

In each first timeslot of driving cycles, the electrical level of CK_A is positive, the electrical level of CKP_A is zero. At this time, the NMOS of charging control unit connected with first color sub-pixel unit (Red color R1) is conducting and PMOS of charging control unit connected with first color sub-pixel unit (Red color R1) is non-conducting. When first timeslot ends, the NMOS and PMOS of the charging control unit connected with first color sub-pixel unit (Red color R1) are both non-conducting.

In each second timeslot of driving cycles, the electrical level of CK_B is positive, the electrical level of CKP_B is negative. At this time, the NMOS and PMOS of charging control unit connected with second color sub-pixel unit (Green color G1) are both conducting. When second timeslot ends, the NMOS and PMOS of the charging control unit connected with second color sub-pixel unit (Green color G1) are both non-conducting.

In each third timeslot of driving cycles, the electrical level of CK_C is positive, the electrical level of CKP_C is zero. At this time, the NMOS of charging control unit connected with third color sub-pixel unit (Blue color B1) is conducting and PMOS of charging control unit connected with third color sub-pixel unit (Blue color B1) is non-conducting. When third timeslot ends, the NMOS and PMOS of the charging control unit connected with third color sub-pixel unit (Blue color B1) are both non-conducting.

In each fourth timeslot of driving cycles, the electrical level of CK_D is positive, the electrical level of CKP_D is zero. At this time, the NMOS of charging control unit connected with first color sub-pixel unit (Red color R2) is conducting and PMOS of charging control unit connected with first color sub-pixel unit (Red color R2) is non-conducting. When fourth timeslot ends, the NMOS and PMOS of the charging control unit connected with first color sub-pixel unit (Red color R2) are both non-conducting.

In each fifth timeslot of driving cycles, the electrical level of CK_E is positive, the electrical level of CKP_E is negative. At this time, the NMOS and PMOS of charging control unit connected with second color sub-pixel unit (Green color G2) are both conducting. When fifth timeslot ends, the NMOS and PMOS of the charging control unit connected with second color sub-pixel unit (Green color G2) are both non-conducting.

In each sixth timeslot of driving cycles, the electrical level of CK_F is positive, the electrical level of CKP_F is zero. At this time, the NMOS of charging control unit connected with third color sub-pixel unit (Blue color B2) is conducting and PMOS of charging control unit connected with third color sub-pixel unit (Blue color B2) is non-conducting. When sixth timeslot ends, the NMOS and PMOS of the charging control unit connected with third color sub-pixel unit (Blue color B2) are both non-conducting.

As FIG. 6b illustrates, when driving the display panel for displaying, the driving signals transmitted by the driving circuit would only change the electrical level 8 times in each driving cycle. Relatively, the NMOS of the charging control unit connected with the driving circuit would experience 6 times of conducting and non-conducting. The PMOS of the charging control unit connected with the driving circuit would only experience 2 time of conducting and non-conducting. The power consumption during driving display panel is apparently reduced.

Figure 7:
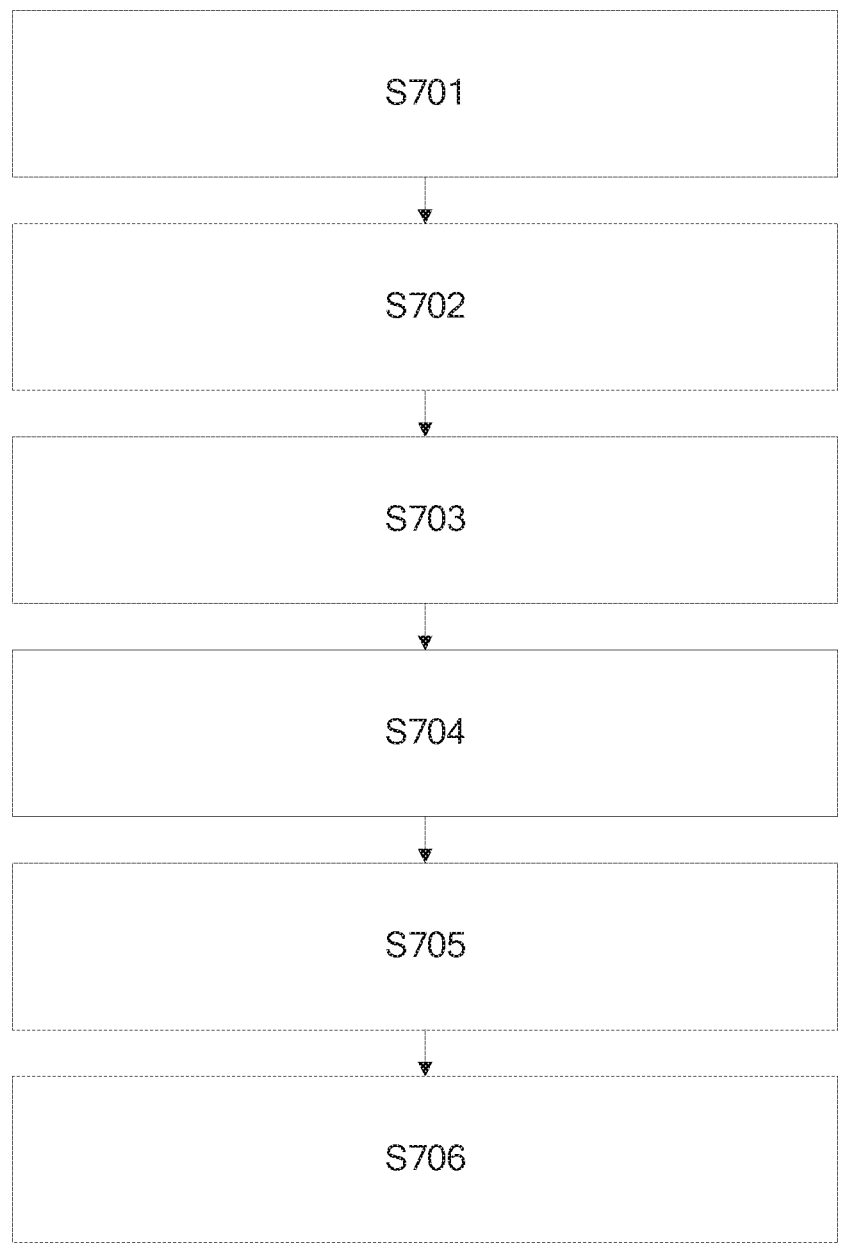
FIG. 7 is a flowchart of a method of driving display panel according to another embodiment of present invention.

Referring to FIG. 7 which is a flowchart of a method of driving display panel according to another embodiment of present invention, the method comprises:

S701, regulating electrical levels of the driving signals transmitted by said driving circuit in said first timeslot to said first charging control unit corresponding to said first color sub-pixel unit, and charging said first color sub-pixel unit via said first thin-film-transistor of said first charging control unit by said charging data.

S702, regulating electrical levels of the driving signals transmitted by said driving circuit in said second timeslot to said second charging control unit corresponding to said second color sub-pixel unit, and charging said second color sub-pixel unit via said first thin-film-transistor and second thin-film-transistor of said second charging control unit by said charging data.

S703, regulating electrical levels of the driving signals transmitted by said driving circuit in said third timeslot to said third charging control unit corresponding to said third color sub-pixel unit, and charging said third color sub-pixel unit via said first thin-film-transistor of said third charging control unit by said charging data.

S704, regulating electrical levels of the driving signals transmitted by said driving circuit in said fourth timeslot to said fourth charging control unit corresponding to said first color sub-pixel unit, and charging said first color sub-pixel unit via said first thin-film-transistor of said fourth charging control unit by said charging data.

S705, regulating electrical levels of the driving signals transmitted by said driving circuit in said fifth timeslot to said fifth charging control unit corresponding to said second color sub-pixel unit, and charging said second color sub-pixel unit via said first thin-film-transistor and second thin-film-transistor of said fifth charging control unit by said charging data.

S706, regulating electrical levels of the driving signals transmitted by said driving circuit in said sixth timeslot to said sixth charging control unit corresponding to said third color sub-pixel unit, and charging said third color sub-pixel unit via said first thin-film-transistor of said sixth charging control unit by said charging data.

To more explanation, regarding details of this embodiment of present invention, related description of driving method of display panel in flowchart steps S401 to S403 are intentionally omitted here for clarity.

In this embodiment of present invention, the PMOS of the charging control unit connected with first color sub-pixel unit and third color sub-pixel unit are kept non-conducting. When charging, only the NMOS of the charging control unit connected with them is conducting. Therefore, it would not impact the overall brightness of single pixel. Moreover, the electrical level switching and counts of PMOS of the charging control unit as conducting or non-conducting during driving display panel are reduced, resulting in reduce of power consumption during driving display panel.

Aforesaid display panels may be any sorts of cell phones, tablets, e-paper, and digital-photo-frame which are mere preferred embodiments and application of technical principle. It is understood for persons skilled in the arts that the described specific embodiments are not for limiting present invention. For persons skilled I th e arts simple deductions, re-modification, and substitutions can be reached and should be included without departing the protection scope of present invention. Therefore, detail explanation with aforesaid embodiments of present invention is not for limiting here. Without departing from the concept of present invention, equivalent embodiments could be included, and the protection scope of present invention should be interpreted by the claims.

What is claimed is:

1. A method for driving a display panel, wherein the display panel comprises a driving circuit, a plurality of charging control units, and a plurality of pixel units, each said pixel units comprises a first color sub-pixel unit, a second color sub-pixel unit, and a third color sub-pixel unit, brightness of each said second color sub-pixel units has largest proportion among each said sub-pixel units, each said charging control units is composed of a first thin-film-transistor and a second thin-film-transistor, initial state of each said first thin-film-transistors and each said second thin-film-transistors is non-conducting, said driving circuit is connected with said charging control units to transmit a driving signal and a charging data to each said charging control units, each said charging control units is connected with sub-pixel units of corresponding color respectively to control charging of sub-pixel units with single type of color;

wherein said driving cycle includes a first timeslot, a second timeslot, and a third timeslot, and said method comprises:

regulating electrical levels of the driving signals transmitted by said driving circuit in said first timeslot to said first charging control unit corresponding to said first color sub-pixel unit, enabling said first thin-film-transistor of said first charging control unit conducting and keeping said second thin-film-transistor of said first charging control unit non-conducting, and charging said first color sub-pixel unit via said first thin-film-transistor of said first charging control unit by said charging data;

regulating electrical levels of the driving signals transmitted by said driving circuit in said second timeslot to said second charging control unit corresponding to said second color sub-pixel unit, enabling said first thin-film-transistor and said second thin-film-transistor of said second charging control unit both conducting, and charging said second color sub-pixel unit via said first thin-film-transistor and said second thin-film-transistor of said second charging control unit by said charging data; and regulating electrical levels of the driving signals transmitted by said driving circuit in said third timeslot to said third charging control unit corresponding to said third color sub-pixel unit, enabling said first thin-film-transistor of said third charging control unit conducting and keeping said second thin-film-transistor of said third charging control unit non-conducting, and charging said third color sub-pixel unit via said first thin-film-transistor of said third charging control unit by said charging data.

2. The method according to claim 1, wherein regulating electrical levels of the driving signals transmitted by said driving circuit in said first timeslot to said first charging control unit corresponding to said first color sub-pixel unit, enabling said first thin-film-transistor of said first charging control unit conducting and keeping said second thin-film-transistor of said first charging control unit non-conducting, and charging said first color sub-pixel unit via said first thin-film-transistor of said first charging control unit by said charging data comprises:

regulating electrical levels of the driving signals transmitted by said driving circuit at the beginning of said first timeslot to said first charging control unit corresponding to said first color sub-pixel unit, enabling said first thin-film-transistor of said first charging control unit conducting and keeping said second thin-film-transistor of said first charging control unit non-conducting, and charging said first color sub-pixel unit via said first thin-film-transistor of said first charging control unit by said charging data; and regulating electrical levels of the driving signals transmitted by said driving circuit at the end of said first timeslot to said first charging control unit corresponding to said first color sub-pixel unit, enabling said first thin-film-transistor of said first charging control unit non-conducting and keeping said second thin-film-transistor of said first charging control unit non-conducting, and preventing charging said first color sub-pixel unit via said first thin-film-transistor of said first charging control unit with said charging data.

3. The method according to claim 1, wherein regulating electrical levels of the driving signals transmitted by said driving circuit in said second timeslot to said second charging control unit corresponding to said second color sub-pixel unit, enabling said first thin-film-transistor and said second thin-film-transistor of said second charging control unit both conducting, and charging said second color sub-pixel unit via said first thin-film-transistor and said second thin-film-transistor of said second charging control unit by said charging data comprises:

regulating electrical levels of the driving signals transmitted by said driving circuit at the beginning of said second timeslot to said second charging control unit corresponding to said second color sub-pixel unit, enabling said first thin-film-transistor and said second thin-film-transistor of said second charging control unit both conducting, and charging said second color sub-pixel unit via said first thin-film-transistor and said second thin-film-transistor of said second charging control unit by said charging data; and regulating electrical levels of the driving signals transmitted by said driving circuit at the end of said second timeslot to said second charging control unit corresponding to said second color sub-pixel unit, enabling said first thin-film-transistor and said second thin-film-transistor of said second charging control unit both non-conducting, and preventing charging said second color sub-pixel unit via said first thin-film-transistor and said second thin-film-transistor of said second charging control unit by said charging data.

4. The method according to claim 1, wherein regulating electrical levels of the driving signals transmitted by said driving circuit in said third timeslot to said third charging control unit corresponding to said third color sub-pixel unit, enabling said first thin-film-transistor of said third charging control unit conducting and keeping said second thin-film-transistor of said third charging control unit non-conducting, and charging said third color sub-pixel unit via said first thin-film-transistor of said third charging control unit by said charging data comprises:

regulating electrical levels of the driving signals transmitted by said driving circuit at the beginning of said third timeslot to said third charging control unit corresponding to said third color sub-pixel unit, enabling said first thin-film-transistor of said third charging control unit conducting and keeping said second thin-film-transistor of said third charging control unit non-conducting, and charging said third color sub-pixel unit via said first thin-film-transistor of said third charging control unit by said charging data; and regulating electrical levels of the driving signals transmitted by said driving circuit at the end of said third timeslot to said third charging control unit corresponding to said third color sub-pixel unit, enabling said first thin-film-transistor of said third charging control unit non-conducting and keeping said second thin-film-transistor of said third charging control unit non-conducting, and preventing charging said third color sub-pixel unit via said first thin-film-transistor of said third charging control unit by said charging data.

5. The method according to claim 1, wherein said first color sub-pixel unit displays red color, said second color sub-pixel unit displays green color, and said third color sub-pixel unit displays blue color.

6. The method according to claim 1, wherein said first thin-film-transistor is n-channel metal oxide semiconductor (NMOS) and said second thin-film-transistor is p-channel metal oxide semiconductor (PMOS).

* * * * *